US006576898B2

(12) United States Patent
Waki

(10) Patent No.: US 6,576,898 B2
(45) **Date of Patent: *Jun. 10, 2003**

(54) MASS SPECTROMETER WITH MULTIPOLE ROD TYPE ION LENS

(75) Inventor: Hiroaki Waki, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 147 days.

This patent is subject to a terminal disclaimer.

(21) Appl. No.: 09/865,690

(22) Filed: May 29, 2001

(65) Prior Publication Data

US 2001/0054688 A1 Dec. 27, 2001

(30) Foreign Application Priority Data

Jun. 7, 2000 (JP) ....................................... 2000-170595

(51) Int. Cl.[7] ........................... H01J 49/42; H01J 37/12

(52) U.S. Cl. .................................... 250/292; 250/396 R

(58) Field of Search ................................ 250/292, 294, 250/396 R

(56) References Cited

U.S. PATENT DOCUMENTS 6,239,429 B1 * 5/2001 Blessing et al. ............ 250/292
6,462,338 B1 * 10/2002 Inatsugu et al. ............ 250/292

FOREIGN PATENT DOCUMENTS

| | | |
|---|---|---|
| GB | 2 178 893 | 2/1997 |
| GB | 2 241 270 | 3/2000 |

* cited by examiner

*Primary Examiner*—John R. Lee
*Assistant Examiner*—Paul M. Gurzo
(74) *Attorney, Agent, or Firm*—Kanesaka & Takeuchi

(57) ABSTRACT

In a mass spectrometer, electrode element plates forming a virtual rod electrode have predetermined shapes at rim portions thereof in an ion optical axis side, and the electrode element plates are held at portions away from the ion optical axis by a holder, to thereby form a virtual rod multipole ion lens unit. Also, apart from the ion lens unit, there is provided a terminal unit for applying predetermined voltages to the respective electrode element plates. In the ion lens unit, the electrode element plates to which the same potential is applied are respectively connected by immovable short lines to form the groups. One of the electrode element plates in each group is electrically connected to the terminal unit.

7 Claims, 3 Drawing Sheets

MASS SPECTROMETER WITH MULTIPOLE ROD TYPE ION LENS

BACKGROUND OF THE INVENTION AND RELATED ART STATEMENT

The present invention relates to a mass spectrometer used in a liquid chromatograph mass spectrometer (LC/MS) or the like with a multipole rod type ion lens.

In the mass spectrometer, there is a component called an ion lens which focuses or converges ions flying from a preceding stage, and accelerates ions circumstantially to transfer to a mass spectrograph at a subsequent stage. As the ion lens, various forms of the ion lenses have been proposed heretofore, but recently, an ion lens of a multipole rod type has been used widely. As shown in FIG. 4(*a*), in this ion lens (a number of rods is four in this example, but the number of the rods can be any even number, such as six or eight), voltages, in which high-frequency voltages having phases inverted with each other are superposed to the same direct current (DC) voltage, are applied to electrodes adjacent to each other (for example, electrodes designated by reference numerals 81 and 82). Ions introduced in an extending direction of a long axis (hereinafter referred to as an ion optical axis) x proceed by oscillation in a predetermined cycle due to a high frequency electric field caused by the aforementioned voltages. Thus, an effect of converging or focusing the ions is high, and a large amount of ions can be sent to the subsequent stage.

In the multipole rod type ion lens, although the focusing or convergence is satisfactory, since there is no voltage gradient in the direction of the ion optical axis x, acceleration of the ions is not carried out. Therefore, if the ion lens of this kind is used under a relatively high pressure, a kinetic energy is deprived due to collisions with the residual gas molecules, resulting in a problem that the ions passing through the lens are small.

The assignee of the invention has proposed an ion lens which uses virtual rod electrodes as shown in FIG. 4(*b*) (not prior art) as an ion lens which can accelerate ions while providing an ability in the convergence by the multipole rod type. In this ion lens, each rod electrode is formed of a plurality of electrode element plates 83. A voltage, in which a direct current (DC) voltage changing stepwisely toward the extending direction of the ion optical axis is superposed on the common radio frequency (RF) voltage, is applied to the plurality of electrode element plates 83 constituting a single virtual rod electrode 84. Between the virtual rod electrodes 84 adjacent to each other, phases of the high frequency components in the applied voltage are inverted, and the same DC voltage components are provided to the electrode element plates 83 existing on the same plane.

When ions generated in the ionization chamber at the preceding stage are introduced to the ion lens described above, the ions proceed while oscillating due to the electric field formed by the high frequency voltage, and the ions are converged on a rear focusing position. Also, by the predetermined direct current potential gradient in the ion optical axis direction, the kinetic energy is provided to the ions so that the ions are accelerated. Therefore, even if the ions collide with the residual gas molecules while the ions are flying, the ions proceed without extremely diverting the convergence track. Accordingly, for example, if a skimmer having a through hole communicating with the subsequent stage is disposed in the vicinity of the rear focusing position, a large number of ions can be sent to the subsequent stage via the through hole. Incidentally, a structure in which electrode element plates 85 are disposed closer to the ion optical axis x as the ions proceed as shown in FIG. 4(*c*) has been proposed by the assignee as well (not prior art).

Although the ion lens using the virtual rod electrodes has the excellent characteristics as described above, since the single rod electrode is separated into a plurality of the electrode element plates, a number of the components is increased naturally, resulting in the problem that the difficulty in assembly and adjustment at the time of manufacturing and using is increased.

The present invention has been made to solve the problems described above, and an object of the invention is to provide a mass spectrometer which includes a virtual rod multipole ion lens for facilitating the assembly at the time of manufacturing and the adjustment at the time of manufacturing and using.

Further objects and advantages of the invention will be apparent from the following description of the invention.

SUMMARY OF THE INVENTION

To achieve the aforementioned object, the present invention provides a mass spectrometer using a virtual rod multipole ion lens formed of virtual rod electrodes. Each virtual rod electrode comprises a plurality of electrode element plates separated away from each other in a direction of an ion optical axis. The electrode element plate forming the virtual rod electrode has a predetermined shape at least a rim portion at an ion optical axis side. The respective electrode element plates are held and fixed at portions away from the ion optical axis by a holding unit formed of an insulator, so that the virtual rod multipole ion lens is made as a unit.

Also, apart from the virtual rod multipole ion lens unit, it is desirable to provide a terminal unit for applying predetermined voltages to the respective electrode element plates. In this case, in the virtual rod multipole ion lens unit, the electrode element plates to which the same potential is applied are connected by a stationary short line. Then, at least one of the electrode element plates which are made into groups is electrically connected to one of a socket and a plug. This connection is carried out in the respective groups. On the other hand, in the terminal unit, the other of the socket and plug is fixed at each position corresponding to one of the socket and plug connected to the electrode element plates.

Since ions proceed in the vicinity of the ion optical axis, in order to control the motions of the ions, it is sufficient to control an electric field in the vicinity of the ion optical axis adequately. In order to control the electric field in the vicinity of the ion optical axis adequately, it is enough that each electrode element plate has a predetermined shape at a rim portion thereof in the ion optical axis side. This "predetermined shape" constitutes a shape theoretically determined, or a shape similar thereto and can be easily processed, and the predetermined shape is directed to a shape which can be actually used within a tolerance. More specifically, the predetermined shape constitutes a hyperbolic shape or circular arc shape.

Therefore, in the other portion, i.e. a portion away from the ion optical axis), the electrode element plate can have a favorable shape in accordance with the other condition or the like. In the mass spectrometer of the invention, the respective electrode element plates are held at the other portions thereof by the holding unit formed of the insulator, to fix the positions of the electrode element plates. Accordingly, it is possible to fix the positions securely in case of adjusting at the time of manufacturing and using the mass spectrometer. Also, since the entire ion lens including all of the electrode element plates becomes a single unit, it is very convenient to handle the lens. Incidentally, the holding unit formed of the insulator can be adequately divided as long as the holding unit as a whole is fixed in the single unit finally.

As described above, in the multipole type ion lens, high frequency voltages having reversed phases are applied to the rods adjacent to each other. Therefore, even if a number of rods is four, six or eight, two kinds of the high frequency voltages to be applied will suffice. Namely, although the direct current voltages applied to the plurality of the electrode element plates forming the single virtual rod are different, there are only two kinds of the voltages (combined voltage of high frequency voltage and direct current voltage) applied to the plurality (even number) of the electrode element plates which exist on the single plane vertical to the ion optical axis. Thus, in the virtual rod multipole ion lens unit of the mass spectrometer according to the present invention, the electrode element plates to which the same voltage (combined voltage) is applied are connected to each other by the short line (current-carrying line) in the unit. Therefore, a number of lines which should be connected to the unit can be greatly reduced. Accordingly, the connection error or failure at the time of manufacture or reassembly can be prevented, and a possibility of trouble due to contact failure can be reduced.

The short lines are made as stationary lines. This means that the positions of the short lines are fixed with respect to the entire unit, and even if the entire unit is slightly moved, the short lines do not move with respect to the entire unit.

The combined voltages applied to the ion lens are generated in a voltage applying unit disposed separately, and in order to stabilize the generated voltages, the voltage applying unit and the ion lens are adjusted to form a resonant circuit. In the liquid chromatograph mass spectrometer (LC/MS) or the like, since the ion lens used therein is gradually contaminated by the sample, it is necessary to clean the ion lens adequately. In this case, if the positions of the short lines are changed in case of removing or attaching the unit, or in case of cleaning the electrode element plates of the unit, the floatation capacity is changed, so that the cumbersome voltage adjustment has to be carried out again. By immobilizing the short lines as in the present invention, the above problem can be prevented.

The terminal unit is provided to correspond to the situation that the virtual rod multipole ion lens unit is integrally formed. Namely, by attaching the terminal unit to the virtual rod multipole ion lens unit, the electrical connection to the respective electrode element plates can be carried out at once by one action. Accordingly, the operations at the time of manufacturing and reassembling can be facilitated, and also, the change in the flotation capacity is eliminated, to thereby facilitate the adjustment of the voltage.

BRIEF DESCRIPTION OF THE DRAWINGS

FIG. 2(*b*) is a front view of the lens unit portion shown in FIG. 2(*a*);

FIG. 3(*b*) is a front view of the terminal unit portion;

FIG. 3(*c*) is an enlarged sectional view of a socket section;

FIG. 4(*b*) is a schematic structural view of a virtual rod multipole ion lens; and FIG. 4(*c*) is a schematic structural view of a modified virtual rod multipole ion lens.

DETAILED DESCRIPTION OF THE PREFERRED EMBODIMENTS

Figure 1:
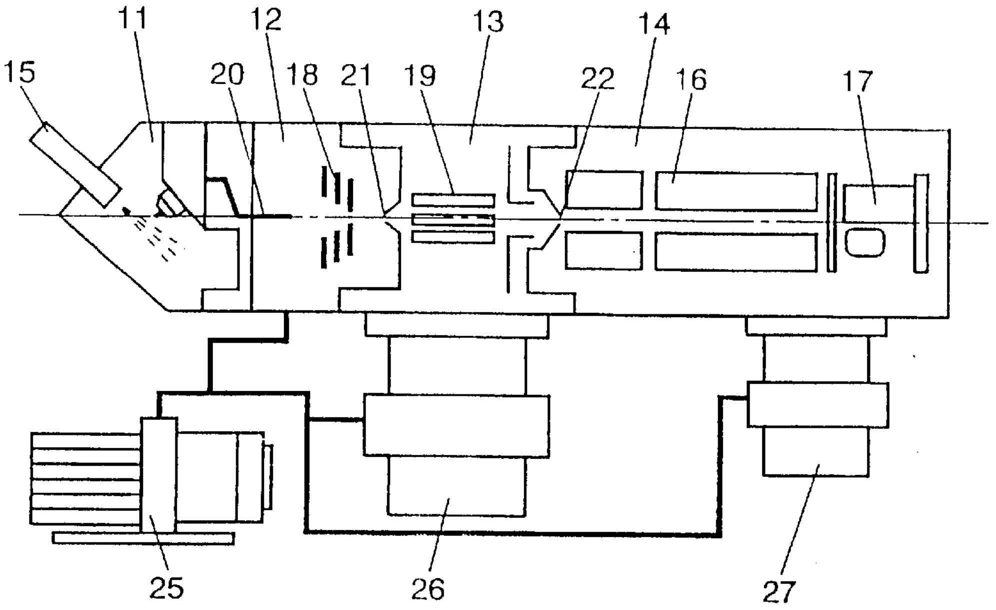
FIG. 1 is a schematic structural view of a liquid chromatograph mass spectrometer as an embodiment of the invention.

A liquid chromatograph mass spectrometer according to the present invention will be explained with reference to the attached drawings. A structure of the mass spectrometer is shown in FIG. 1, and the mass spectrometer is provided with an ionization chamber 11, a mass spectrometry detection chamber 14, a first intermediate chamber 12 and a second intermediate chamber 13. The first intermediate chamber 12 and the second intermediate chamber 13 are disposed between the ionization chamber 11 and the mass spectrometry detection chamber 14, and are respectively separated from each other by partition walls. In the ionization chamber 11, a nozzle 15 connected to an outlet end of a column of the liquid chromatograph apparatus is disposed.

In the mass spectrometry detection chamber 14, a quadrupole filter 16 and an ion detector 17 are disposed, and in the first intermediate chamber 12 and the second intermediate chamber 13 which are located between the ionization chamber 11 and the mass spectrometry detection chamber 14, a first ion lens 18 and a second ion lens 19 are respectively provided. The ionization chamber 11 and the first intermediate chamber 12 are communicated with each other only through a solvent removing pipe 20 with a small diameter, and the first intermediate chamber 12 and the second intermediate chamber 13 are communicated with each other only through a skimmer 21 having a through hole (orifice) with a very small diameter. Also, the second intermediate chamber 13 and the mass spectrometry detection chamber 14 are communicated with each other through a small hole 22.

An inside of the ionization chamber 11 is approximately in an atmospheric pressure by evaporated molecules of a sample liquid continuously supplied from the nozzle 15, and on the other hand, an inside of the mass spectrometry detection chamber 14 is evacuated to a high vacuum condition in a range of approximately $10^{-3}$ to $10^{-4}$ Pa by a turbo-molecular pump (TMP) 27. Since ions must pass from the ionization chamber 11 to the mass spectrometry detection chamber 14, which have a big difference in the degree of vacuum, the first intermediate chamber 12 and the second intermediate chamber 13 are disposed between the chambers 11 and 14, to thereby increase the degree of vacuum gradually. Incidentally, an inside of the first intermediate chamber 12 is evacuated to approximately $10^{2}$ Pa by a rotary pump (RP) 25, and the second intermediate chamber 13 is evacuated to a range of approximately $10^{-1}$ to $10^{-2}$ Pa by a turbo-molecular pump (TMP) 26.

The sample liquid is sprayed (electro-sprayed) in the ionization chamber 11 from the nozzle 15, and the sample molecules are ionized in a process of vaporizing the solvent in droplets. Droplets which have not been ionized yet, and mist containing the ions are sucked into the solvent removing pipe 20 due to the pressure difference between the ionization chamber 11 and the first intermediate chamber 12, and ionization proceeds in the step of passing through the solvent removing pipe 20. In the first intermediate chamber 12, the first ion lens 18 is provided, and while an electric field by the first ion lens 18 helps sucking of the ions through the solvent removing pipe 20, the ions are converged in the vicinity of the orifice of the skimmer 21. As the first ion lens 18, a virtual rod multipole ion lens is used.

After the ions introduced into the second intermediate chamber 13 through the orifice of the skimmer 21 are converged by the second ion lens 19 and accelerated, the ions are sent to the mass spectrometry detection chamber 14. As the second ion lens 19, a regular (solid) rod type multipole ion lens is used.

In the mass spectrometry detection chamber 14, only ions having a specific mass number (mass m/charge z) can pass through a space at a center of the quadrupole filter 16 in a longitudinal direction, and reach the ion detector 17 to be detected.

Figure 2A:
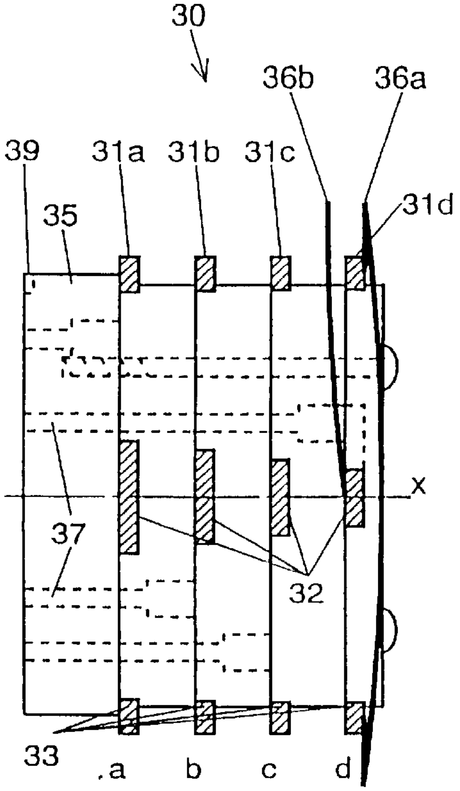
FIG. 2(*a*) is a side view of a lens unit portion of a first ion lens used in a first intermediate chamber of the liquid chromatograph mass spectrometer as the embodiment of the invention.
Figure 2B:
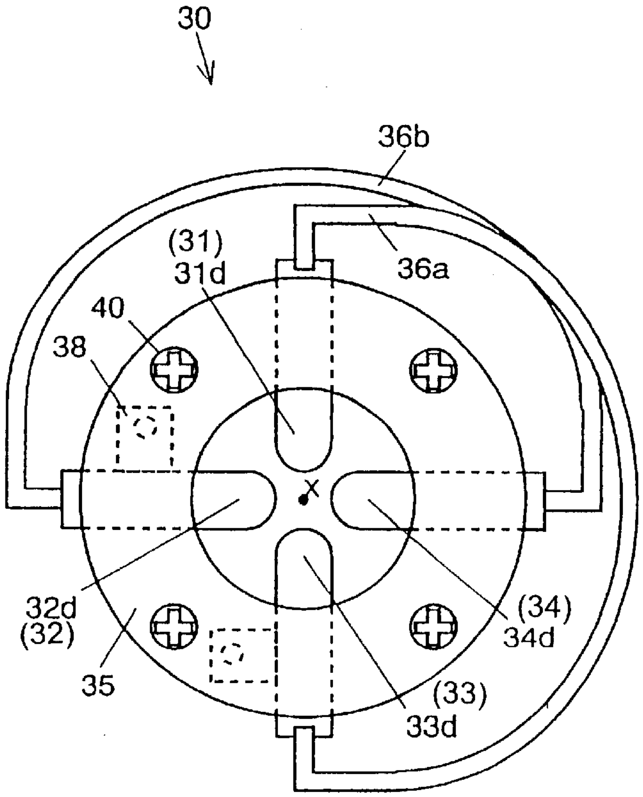

Detailed structure of the first ion lens 18 is shown in FIGS. 2(*a*), 2(*b*) and 3(*a*)–3(*c*). The first ion lens 18 is divided into a virtual rod multipole lens unit 30, shown in FIGS. 2(*a*) and 2(*b*), and a terminal unit 50, shown in FIGS. 3(*a*) through 3(*c*), which is provided for applying voltages to the respectively electrode element plates forming the virtual rod multipole lens unit 30. The virtual rod multipole lens unit 30 and the terminal unit 50 are connected together by one-action.

The virtual rod multipole lens unit 30 is a type formed of four poles and four rows or levels. Namely, four sheets of electrode element plates 31*a*, 31*b*, 31*c* and 31*d* arranged in a row in the direction of the ion optical axis x constitute a single virtual rod (although not shown in the figures, the rod is virtually designated by numeral 31), and four virtual rods (31, 32, 33 and 34) are disposed symmetrically around the ion optical axis x spaced at 90 degrees apart from each other, to thereby constitute the four poles. Also, on a plane vertical to the ion optical axis x, four sheets of electrode element plates 31*d*, 32*d*, 33*d* and 34*d*, shown in FIG. 2(*b*), which are disposed symmetrically to be spaced at 90 degrees apart from each other around an intersection between the plane and the ion optical axis x, are considered to be one row or level, and four planes (a, b, c and d) of this kind are arranged side by side in the direction of the ion optical axis x to form the four levels or rows. Therefore, the virtual rod multipole lens unit 30 contains sixteen sheets of electrode element plates 31*a* through 34*d*.

The sixteen sheets of the electrode element plates 31*a* through 34*d* are made of metallic plates, and fixed to the holder 35 made of an insulator, such as Teflon resin ("Teflon" is a trademark by E. I. du Pont de Nemours & Co., Inc.). As shown in FIG. 2(*b*), each of the electrode element plates 31*a* through 34*d* has a slightly elongate shape, and one end thereof has an arc shape. Each of the electrode element plates 31*a* through 34*d* is fixed to the holder 35 such that the end in the arc shape comes to a side of the ion optical axis x. Also, the entire unit 30 is fixed by screws 40 or the like.

Figure 4A:
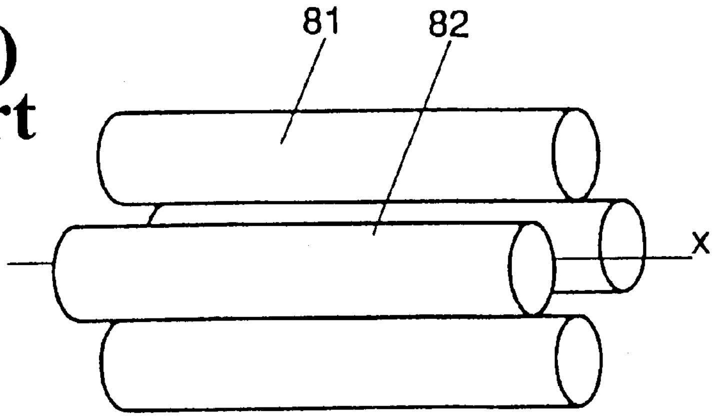
Fig. 4(a) Prior Art
FIG. 4(*a*) is a schematic structural view of a conventional rod type multipole ion lens.
Figure 4B:
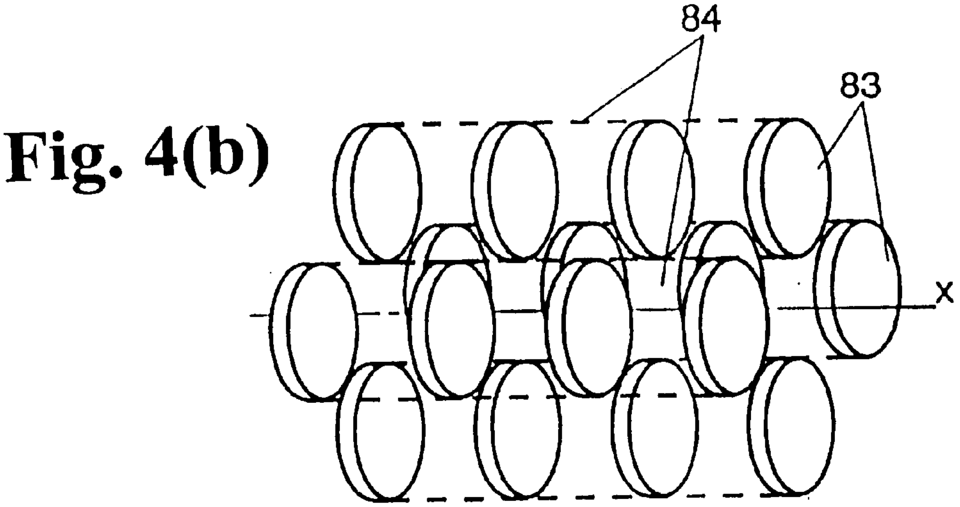
Figure 4C:
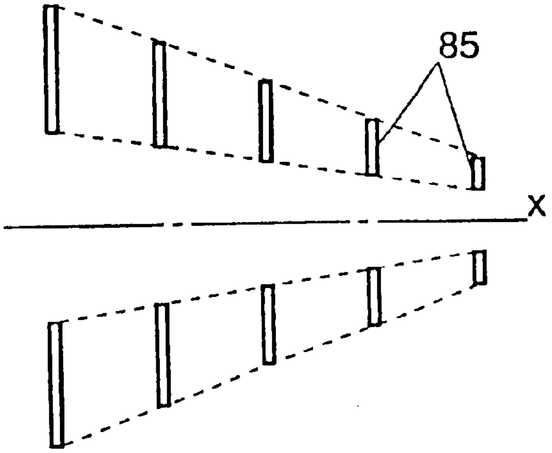

As shown in FIG. 4(*c*), the virtual rod multipole lens unit 30 of the invention is structured such that the electrode element plates 31*a* through 31*d* are located closer to the ion optical axis x as the ions proceed along the ion optical axis x. In response thereto, it is set that a radius of curvature of the arc of the aforementioned end at the side of the ion optical axis x in each of the electrode element plates 31*a* through 31*d* is gradually decreased, and the widths of the electrode element plates 31*a* through 31*d* are decreased accordingly. Incidentally, in FIG. 2(*b*), only the electrode element plates 31*d*, 32*d*, 33*d* and 34*d* at the frontmost side are shown, and the rest of the electrode element plates 31*a* through 34*a*, 31*b* through 34*b*, and 31*c* through 34*c*, which are located at a rear side, are omitted and not shown in the figure to simplify the drawing.

As described above, since the same voltages are applied to the alternate rod electrodes in the multipole ion lens, as shown in FIG. 2(*b*), in the ion lens unit 30 of the embodiment, short lines 36*a* and 36*b* are respectively extended between the electrode element plates (31*d*, 33*d*) to which the same voltage is applied, and between the electrode element plates (32*d*, 34*d*) to which the same voltage is applied. The short lines 36*a* and 36*b* are made of sheet metals, and fixed to other ends, which are not the side of the ion optical axis x, of the respective electrode element plates 31*d*, 32*d*, 33*d* and 34*d*. Therefore, the short lines 36*a* and 36*b* are also fixed to the entire unit 30, and even if the unit 30 is handled in case of maintenance or the like, positions of the short lines 36*a* and 36*b* are not changed with respect to the unit 30. Accordingly, change of floatation capacity is prevented, and cumbersome readjustment of the power source is not necessary.

Figure 3A:
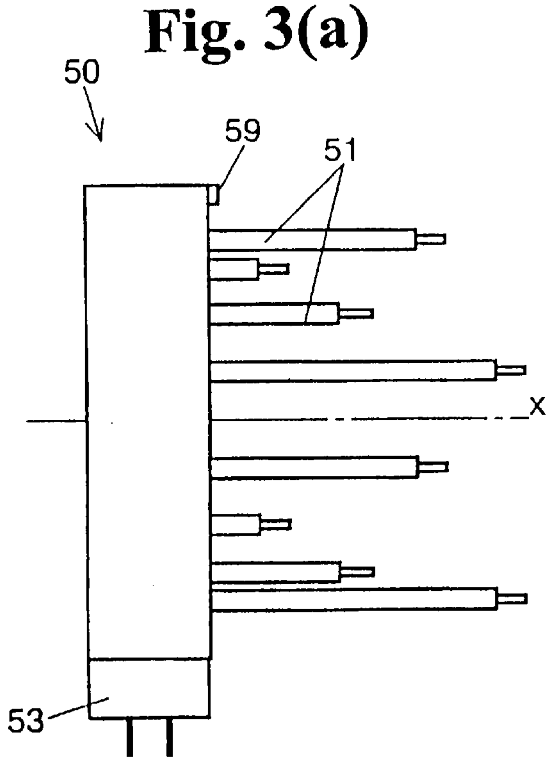
FIG. 3(*a*) is a side view of a terminal unit portion of the first ion lens.
Figure 3B:
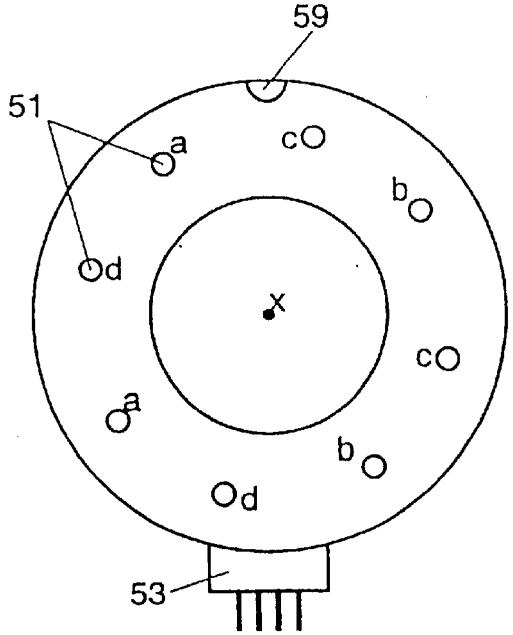
Figure 3C:
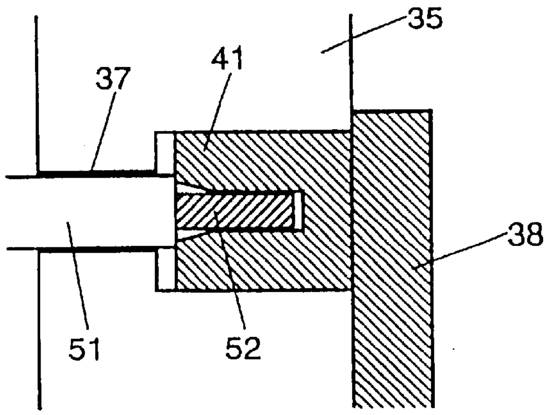

The terminal unit 50 shown in FIGS. 3(*a*) through 3(*c*) corresponds to the virtual rod multipole lens unit 30 in FIGS. 2(*a*) and 2(*b*), and the unit 50 is attached from a left side in FIG. 2(*a*). Eight lead pins 51 are fixed to the terminal unit 50. As described above, four sheets of the electrode element plates in each row of the multipole lens unit 30 are divided into two groups, and the same voltages are applied to the respective groups, so that eight kinds of voltages in total are required to be supplied to the multipole lens unit 30. The eight lead pins 51 in the terminal unit 50 correspond thereto, and in the multipole lens unit 30, eight holes 37 corresponding to the lead pins 51 are formed as shown in FIG. 2(*a*). The eight lead pins 51 are formed of four kinds of pins, each kind having two pins with the same length. The two pins having the same length correspond to the electrode element plates of two groups in the same row in the multipole lens unit 30, and the four kinds of different lengths correspond to the four rows in the multipole lens unit 30.

A distal end of each hole 37 is provided with a socket 41 as shown in FIG. 3(*c*), and each socket 41 receives a metal wire 52 projected from and exposed at a distal end of each lead pin 51. Each socket 41 is electrically connected to a protruding portion 38 of the electrode element plate, shown in FIG. 2(*b*), representing the group of the electrode element plates to which the same voltage is applied.

Also, the terminal unit 50 is connected to a connector 53 which transmits voltages from a voltage supply source disposed externally to the eight lead pins 51. Therefore, predetermined voltages (RF+DC) from the voltage supply source are applied to all of the sixteen electrode element plates 31*a* through 34*d* by passing through the connector 53, the lead pins 51, the sockets 41, the protruding portions 38, the representative electrode element plates, and the short lines 36*a* and 36*b*.

Incidentally, in order to facilitate positioning or aligning in case of connecting the terminal unit 50 and the virtual rod multipole lens unit 30, an engaging projection 59 is formed in the terminal unit 50, and a concave portion 39 is formed in the virtual rod multipole lens unit 30.

As described above, according to the mass spectrometer of the invention, since the lens unit and the terminal unit are respectively made into units, by attaching both units with each other by one action, there is no connection error or failure, and without causing the change in the floatation capacity, the accurate voltages can be respectively applied to the electrode element plates in the lens unit.

While the invention has been explained with reference to the specific embodiments of the invention, the explanation is illustrative and the invention is limited only by the appended claims.

What is claimed is:

1. A mass spectrometer, comprising:

a virtual rod multipole ion lens formed of a plurality of virtual rod electrodes, each virtual rod electrode being formed of a plurality of electrode element plates spaced from each other at several stages along an ion optical axis, each of said electrode element plates having a predetermined shape at at least a rim portion thereof at a side of the ion optical axis; and a holding unit formed of an insulator, said holding unit holding and fixing the respective electrode element plates at portions spaced from the ion optical axis so that the virtual rod multipole ion lens is made as a unit.

2. A mass spectrometer according to claim 1, further comprising a terminal unit connected to the holding unit for providing voltages to the electrode element plates.

3. A mass spectrometer according to claim 2, wherein said virtual rod electrodes are formed of even number of virtual rod electrodes more than four equally spaced apart from each other around the ion optical axis, one of the electrode element plates in one virtual rod electrode being located adjacent to one of the electrode element plates in another virtual rod electrode so that at least four electrode element plates are located in one plane to form one of the stages for the respective virtual rod electrodes.

4. A mass spectrometer according to claim 3, further comprising immovable short lines for connecting every other electrode element plate together in one stage respectively to thereby form two groups connected by sort lines in one stage, said short lines being connected to the terminal unit.

5. A mass spectrometer according to claim 4, wherein said holding unit has first connectors connected to the respective short lines, and said terminal unit has second connectors connected to the first connectors.

6. A mass spectrometer according to claim 3, wherein each electrode element plate has a curved surface projecting toward the ion optical axis, and a distance from an inner end of the curved surface to the ion optical axis gradually decreases in the stages along a moving direction of ion.

7. A mass spectrometer according to claim 1, further comprising an ionization chamber, a first intermediate chamber, a second intermediate chamber, and a mass spectrometry detection chamber connected to each other, said virtual rod electrodes being disposed in the first intermediate chamber.

* * * * *